(12) United States Patent
Ohkoshi et al.

(10) Patent No.: US 10,076,029 B2
(45) Date of Patent: Sep. 11, 2018

(54) METHOD FOR PRODUCING PRINTED WIRING BOARD

(71) Applicant: Ajinomoto Co., Inc., Tokyo (JP)

(72) Inventors: Masanori Ohkoshi, Kawasaki (JP); Ikumi Sawa, Kawasaki (JP); Genjin Mago, Kawasaki (JP); Eiichi Hayashi, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 368 days.

(21) Appl. No.: 14/633,582

(22) Filed: Feb. 27, 2015

(65) Prior Publication Data

US 2015/0250052 A1  Sep. 3, 2015

(30) Foreign Application Priority Data

Feb. 28, 2014 (JP) ................................. 2014-038359

(51) Int. Cl.
*H05K 1/03* (2006.01)
*C09J 163/00* (2006.01)
(Continued)

(52) U.S. Cl.
CPC ......... *H05K 1/0373* (2013.01); *B32B 37/025* (2013.01); *B32B 37/06* (2013.01); *C09J 7/22* (2018.01); *C09J 7/255* (2018.01); *C09J 163/00* (2013.01); *H05K 3/4673* (2013.01); *B32B 2309/025* (2013.01); *B32B 2457/08* (2013.01); *C08K 3/013* (2018.01);
(Continued)

(58) Field of Classification Search
CPC .............................................. B32B 2309/025
See application file for complete search history.

(56) References Cited

U.S. PATENT DOCUMENTS

| 4,160,799 A * | 7/1979 | Locey ..................... B29C 71/02 |
| | | 264/230 |
| 2005/0008868 A1 | 1/2005 | Nakamura et al. |
| 2005/0129895 A1* | 6/2005 | Nakamura ......... C08G 59/4021 |
| | | 428/40.1 |

FOREIGN PATENT DOCUMENTS

| JP | 5-347461 A | 12/1993 |
| JP | 2005-154727 A | 6/2005 |

(Continued)

OTHER PUBLICATIONS

Office Action dated Oct. 3, 2017 in Japanese Patent Application No. 2014-038359 (with English language translation).

(Continued)

*Primary Examiner* — Ian Rummel
(74) *Attorney, Agent, or Firm* — Oblon, McClelland, Maier & Neustadt, L.L.P.

(57) ABSTRACT

Printed wiring boards, in which the insulating layer exhibits excellent peel strength with respect to a conductive layer after a roughening treatment, even when using a resin composition having a high content of inorganic filler, may be obtained by: (A) laminating, onto an internal layer substrate, an adhesive sheet which includes a support and a resin composition layer in contact with the support, so that the resin composition layer is in contact with the internal layer substrate; (B) thermally curing the resin composition layer to form an insulating layer; and (C) removing the support, when the support satisfies certain conditions (TD1) and (TD2) in a TD direction thereof when it is heated under specific heating conditions.

9 Claims, 2 Drawing Sheets

(51) Int. Cl.
  *H05K 3/00* (2006.01)
  *B32B 38/10* (2006.01)
  *B32B 37/00* (2006.01)
  *B32B 37/06* (2006.01)
  *B32B 37/18* (2006.01)
  *H05K 3/46* (2006.01)
  *C09J 7/22* (2018.01)
  *C09J 7/25* (2018.01)
  *C08K 3/013* (2018.01)

(52) U.S. Cl.
  CPC .... *C09J 2201/122* (2013.01); *C09J 2201/622* (2013.01); *C09J 2203/326* (2013.01); *C09J 2205/102* (2013.01); *C09J 2463/00* (2013.01); *C09J 2467/006* (2013.01); *H05K 2201/0209* (2013.01); *H05K 2203/06* (2013.01); *Y10T 428/24843* (2015.01); *Y10T 428/2826* (2015.01)

(56) References Cited

FOREIGN PATENT DOCUMENTS

| | | |
|---|---|---|
| JP | 2008-189711 A | 8/2008 |
| JP | 2008-198774 A | 8/2008 |
| JP | 2009-73889 A | 4/2009 |
| JP | 2013-100379 A | 5/2013 |
| TW | 2012-02305 | 1/2012 |

OTHER PUBLICATIONS

Office Action dated Apr. 20, 2018, in corresponding Taiwanese Patent Application 104100398, with English translation.

\* cited by examiner

METHOD FOR PRODUCING PRINTED WIRING BOARD

CROSS REFERENCES TO RELATED APPLICATIONS

This application claims priority to Japanese Patent Application No. 2014-038359, filed on Feb. 28, 2014, which is incorporated herein by reference in its entirety.

BACKGROUND OF THE INVENTION

Field of the Invention

The present invention relates to methods for producing a printed wiring board. The present invention also relates to printed wiring board produced by such a method.

Discussion of the Background

As a technique of producing a printed wiring board, there is known a production method using a build-up process of alternately layering insulating layers and conductive layers. In the production method using the build-up process, an insulating layer is usually formed by thermally curing a resin composition. For example, WO 2010/35451, which is incorporated herein by reference in it is entirety, discloses a technique of forming an insulating layer by: laminating a resin composition layer containing silica particles onto an internal layer substrate using an adhesive sheet including a support and the resin composition layer provided on the support; thermally curing the resin composition layer; and then subjecting the cured product to a roughening treatment.

With the demand for further densification of circuit wirings, there is a tendency toward an increase in the number of stacked layers of a build-up printed wiring board. However, as the number of stacked layers increases, the occurrence of cracks and circuit distortion due to the difference in thermal expansion between the insulating layers and conductive layers becomes a problem. As a technique for suppressing the problem of cracks and circuit distortion, for example, JP-A-2010-202865, which is incorporated herein by reference in its entirety, discloses a technique of forming an insulating layer with a low thermal expansion coefficient by increasing the content of an inorganic filler such as silica particles in the resin composition.

In the technique described in WO2010/35451, silica particles on the surface of the cured product are detached in the roughening treatment, which allows an insulating layer having sufficient peel strength with respect to a conductive layer to be achieved. However, when using a resin composition having a high content of inorganic filler such as silica particles in order to form an insulating layer with a low thermal expansion coefficient, a reduction in peel strength between the formed insulating layer and conductive layer may be unavoidable even using the above technique.

In the production of a printed wiring board, an insulating layer may be formed by thermally curing a resin composition layer in a state such that a support is attached to the resin composition layer, from the viewpoint of the smoothness of the resultant insulating layer and from the viewpoint of masking when via-holes are formed. Particularly in such case, the present inventors have found that, when using a resin composition having a high content of inorganic filler, the reduction in peel strength between the formed insulating layer and conductive layer tends to be significant.

Thus, there remains a need for improved methods for producing a printed wiring board.

SUMMARY OF THE INVENTION

Accordingly, it is one object of the present invention to provide novel methods for producing a printed wiring board.

It is another object of the present invention to provide novel methods for producing a printed wiring board, which are capable of forming an insulating layer having an excellent peel strength with respect to a conductive layer after a roughening treatment, even when using a resin composition having a high content of inorganic filler, when the insulating layer is formed by thermally curing a resin composition layer in a state that a support is attached to the resin composition layer.

It is another object of the present invention to provide novel printed wiring board produced by such a method.

These and other objects, which will become apparent during the following detailed description, have been achieved by the inventors' discovery that these objects can be achieved by using an adhesive sheet including a support exhibiting specific expansion characteristics during heating.

Specifically, the present invention provides the following embodiments.

(1) A method for producing a printed wiring board, comprising the following steps (A) to (C) in this order:

(A) laminating, onto an internal layer substrate, an adhesive sheet which includes a support and a resin composition layer in contact with the support, so that the resin composition layer is in contact with the internal layer substrate;

(B) thermally curing the resin composition layer to form an insulating layer; and (C) removing the support, wherein when the support is heated under the following heating condition, the support satisfies the following conditions (TD1) and (TD2) in a TD direction thereof, Heating condition: a temperature is increased from 20° C. to 100° C. at a rate of 8° C./minute, maintained at 100° C. for 30 minutes, then increased to 180° C. at a rate of 8° C./minute, and maintained at 180° C. for 30 minutes, Condition (TD1): a maximum expansion rate $E_{ATD}$ (%) is 0.9% or less, and Condition (TD2): a difference between the maximum expansion rate $E_{ATD}$ (%) and an expansion rate at the end of heating $E_{BTD}$ (%), $E_{ATD}-E_{BTD}$, is 0.5% or less.

(2) The method according to (1), wherein a content of an inorganic filler in the resin composition layer is 50% by mass or more.

(3) The method according to (1) or (2), wherein, when the support is heated under the heating condition, the support has an expansion rate $E_{BMD}$ (%) of less than 0% in an MD direction thereof at the end of heating.

(4) The method according to any one of (1) to (3), wherein the step (B) comprises:

(i) heating the resin composition layer at a temperature $T_1$ (50° C.≤$T_1$<150° C.); and (ii) thermally curing the heated resin composition layer at a temperature $T_2$ (150° C.≤$T_2$≤240° C.).

(5) An adhesive sheet comprising:

a support that satisfies the following conditions (TD1) and (TD2) in a TD direction thereof when the support is heated under the following heating condition, Heating condition: a temperature is increased from 20° C. to 100° C. at a rate of 8° C./minute, maintained at 100° C. for 30 minutes, then increased to 180° C. at a rate of 8° C./minute, and maintained at 180° C. for 30 minutes, Condition (TD1): a maximum expansion rate $E_{ATD}$ (%) is 0.9% or less, and Condition (TD2): a difference between the maximum expansion rate $E_{ATD}$ (%) and an expansion rate at the end of heating $E_{BTD}$ (%), $E_{ATD}-E_{BTD}$, is 0.5% or less; and a resin composition layer in contact with the support.

(6) The adhesive sheet according to (5), wherein, when the support is heated under the heating condition, the support has an expansion rate $E_{BMD}$ (%) of less than 0% in an MD direction thereof at the end of heating.

(7) The adhesive sheet according to (5) or (6), wherein a content of an inorganic filler in the resin composition layer is 50% by mass or more.

(8) A plastic film that satisfies the following conditions (TD1) and (TD2) in a TD direction thereof when the plastic film is heated under the following heating condition, Heating condition: a temperature is increased from 20° C. to 100° C. at a rate of 8° C./minute, maintained at 100° C. for 30 minutes, then increased to 180° C. at a rate of 8° C./minute, and maintained at 180° C. for 30 minutes, Condition (TD1): a maximum expansion rate $E_{ATD}$ (%) is 0.9% or less, and Condition (TD2): a difference between the maximum expansion rate $E_{ATD}$ (%) and an expansion rate at the end of heating $E_{BTD}$ (%) $E_{ATD}-E_{BTD}$, is 0.5% or less.

(9) A semiconductor device comprising a printed wiring board produced by the method according to any one of (1) to (4).

The present method is capable of forming an insulating layer having an excellent peel strength with respect to a conductive layer after a roughening treatment, even if using a resin composition having a high content of filler, when the insulating layer is formed by thermally curing a resin composition layer in a state that a support is attached to the resin composition layer.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Explanation of Terms.

In the present invention, an "MD direction" of a support is the lengthwise direction of the support when the support is produced. A "TD direction" of the support is the width direction of the support when the support is produced and is perpendicular to the MD direction. Both the MD and TD directions are perpendicular to the thickness direction of the support.

In the present invention, the "expansion rate" of the support in the MD or TD direction of the support is the rate (%) of increase in the length of the support in the MD or TD direction when the support is heated under a predetermined heating condition. The expansion rate (%) of the support is determined from the formula:

$$(L-L_0)/L_0 \times 100,$$

where $L_0$ is the initial length of the support (i.e., the length of the support at the start of heating) and L is the length of the support after heating for a predetermined time. A positive expansion rate represents that the support expands under heating, and a negative expansion rate represents that the support shrinks under heating. The expansion rate (%) of the support can be determined by measuring a change in the length of the support in the MD or TD direction during heating under a predetermined heating condition using a thermomechanical analysis apparatus. Examples of the thermomechanical analysis apparatus may include "Thermo Plus TMA8310" manufactured by Rigaku Corporation and "TMA-SS6100" manufactured by Seiko Instruments Inc.

In the present invention, the "maximum expansion rate" of the support in the MD or TD direction is the maximum value of the expansion rate when the expansion rate is plotted against heating time.

In the present invention, the "expansion rate of the support at the end of heating" in the MD or TD direction of the support is the expansion rate of the support in the MD or TD direction thereof at the time that the heating condition is removed. For example, when the support is heated under the following heating condition, the "expansion rate at the end of heating" is the expansion rate at the time that 30 minutes has elapsed at 180° C.

Heating condition: A temperature is increased from 20° C. to 100° C. at a rate of 8° C./minute, maintained at 100° C. for 30 minutes, then increased to 180° C. at a rate of 8° C./minute, and maintained at 180° C. for 30 minutes.

In the present invention, the "temperature" in the heating condition refers to the temperature of the atmosphere surrounding the support.

Before describing a method for producing a printed wiring board of the present invention in detail, an "adhesive sheet" used in the method for the present invention will be described.

Adhesive Sheet.

The adhesive sheet used in the method for the present invention includes: a support that satisfies the following conditions (TD1) and (TD2) in the TD direction thereof when the support is heated under the following heating condition; and a resin composition layer in contact with the support.

Heating condition (hereinafter may be referred to as "reference heating condition"): A temperature is increased from 20° C. to 100° C. at a rate of 8° C./minute, maintained at 100° C. for 30 minutes, then increased to 180° C. at a rate of 8° C./minute, and maintained at 180° C. for 30 minutes.

Condition (TD1): The maximum expansion rate $E_{ATD}$ (%) is 0.9% or less.

Condition (TD2): The difference between the maximum expansion rate $E_{ATD}$ (%) and the expansion rate at the end of heating $E_{BTD}$ (%), $E_{ATD}-E_{BTD}$, is 0.5% or less.

Support.

The support used in the adhesive sheet usually expands or shrinks when heated. The degree of expansion and shrinkage of the support varies depending on the types thereof. Due to the production process of the support (for example, the orientation of materials constituting the support, tension when the support is wound, etc.), the support tends to shrink to a greater extent in the MD direction than in the TD direction and tends to expand to a greater extent in the TD direction than in the MD direction when heated. The present inventors have examined the influence of expansion-shrinkage characteristics of the support on the surface properties of the resultant insulating layer when the insulating layer is formed by thermally curing a resin composition layer in a state that the support is attached to the resin composition layer. Consequently, the inventors have found that the expansion characteristics of the support have an influence on the surface roughness of the resultant insulating layer and on the peel strength between the insulating layer and the conductive layer. In the present invention, attention is given to the expansion characteristics of the support in the TD direction thereof. This is because the support tends to expand more easily in the TD direction, as described above. Therefore, if there exists a support that expands to a greater extent in the MD direction than in the TD direction during heating, the present invention may be implemented using such support by reading the TD direction as the MD direction and the MD direction as the TD direction in the present description.

Figure 1:
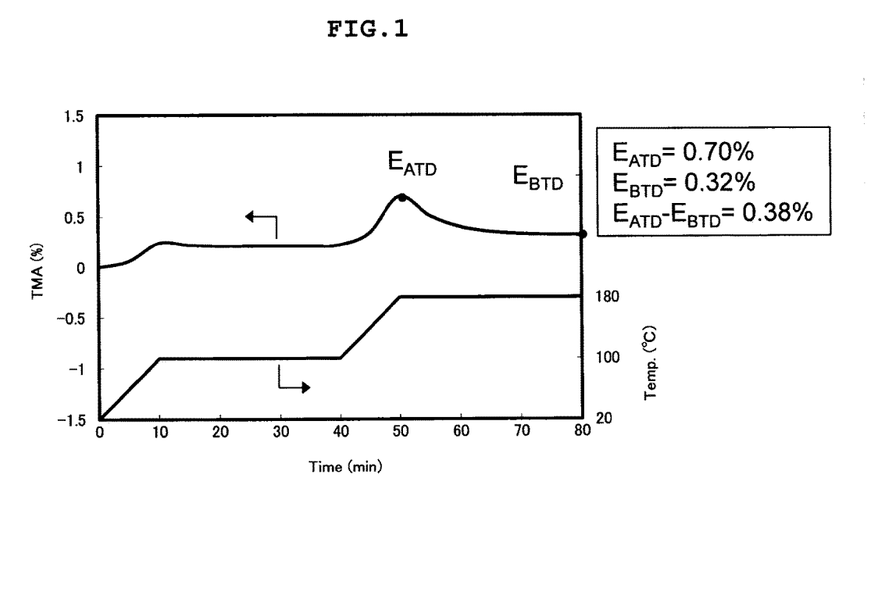
FIG. 1 is a schematic diagram (1) showing the expansion behavior of a support in its TD direction when the support is heated.
Figure 2:
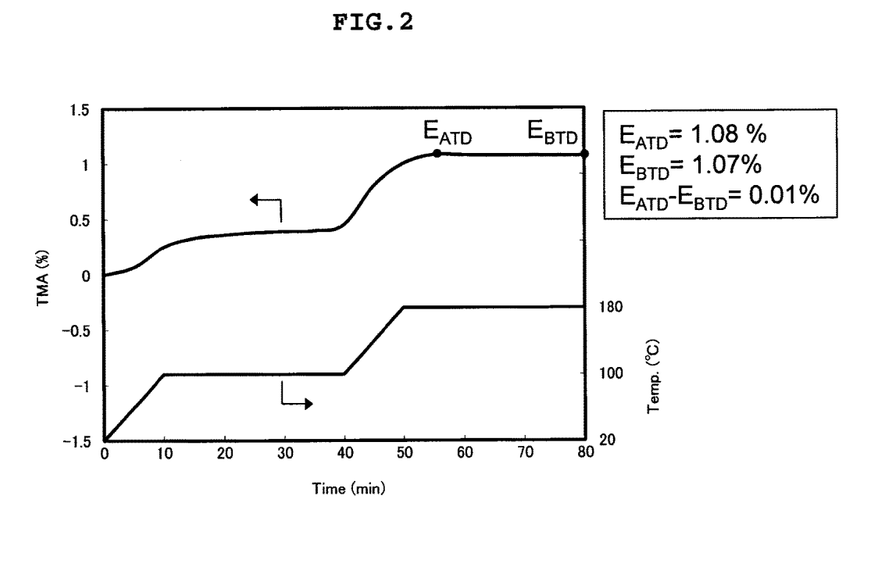
FIG. 2 is a schematic diagram (2) showing the expansion behavior of a support in its TD direction when the support is heated.
Figure 3:
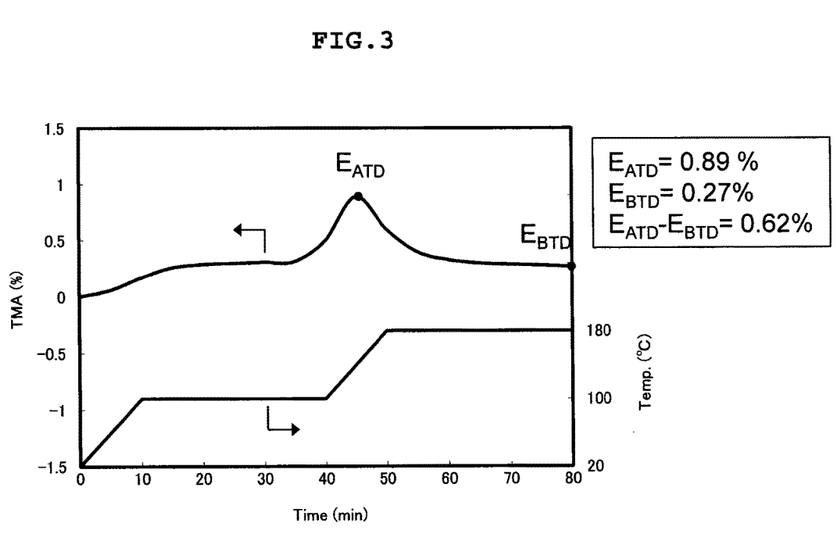
FIG. 3 is a schematic diagram (3) showing the expansion behavior of a support in its TD direction when the support is heated.

FIGS. 1 to 3 each schematically show the expansion behavior of a support in the TD direction thereof when the support is heated under the reference heating condition. In FIGS. 1 to 3, the left vertical axis indicates the expansion rate (%) of a support in the TD direction thereof, the right vertical axis indicates heating temperature (° C.), and the horizontal axis indicates heating time (minutes). In any of the modes shown in FIGS. 1 to 3, the expansion rate increases gradually in a process in which the temperature is increased from 20° C. to 100° C. at a rate of 8° C./minute (in a section from a heating time of 0 minutes to 10 minutes). In a process in which the temperature is maintained at 100° C. for 30 minutes (in a section from a heating time of 10 minutes to 40 minutes), the expansion rate increases slightly or is almost constant. In a process in which the temperature is increased from 100° C. to 180° C. at a rate of 8° C./minute (in a section from a heating time of 40 minutes to 50 minutes), the expansion rate increases. In a process in which the temperature is maintained at 180° C. for 30 minutes (in a section from a heating time of 50 minutes to 80 minutes), the expansion rate decreases or is almost constant.

In each of FIGS. 1 to 3, the maximum expansion rate $E_{ATD}$ and the expansion rate at the end of heating $E_{BTD}$ are shown. In order to form an insulating layer having an excellent peel strength with respect to a conductive layer after a roughening treatment even if using a resin composition having a high content of inorganic filler, it is important that the $E_{ATD}$ and $E_{BTD}$ satisfy the conditions (TD1) and (TD2) when the support is heated under the reference heating condition.

Condition (TD1).

The condition (TD1) relates to the maximum expansion rate $E_{ATD}$. From the viewpoint of forming an insulating layer having an excellent peel strength with respect to a conductive layer after a roughening treatment, even if using a resin composition having a high content of filler, when the insulating layer is formed by thermally curing a resin composition layer in a state that the support is attached to the resin composition layer, the maximum expansion rate $E_{ATD}$ is 0.9% or less, preferably 0.88% or less, more preferably 0.86% or less, still more preferably 0.84% or less, further more preferably 0.82% or less, 0.8% or less, 0.78% or less, 0.76% or less, 0.74% or less, 0.72% or less, and 0.7% or less. Although the lower limit of the maximum expansion rate $E_{ATD}$ is not particularly limited, it may be usually 0.0% or more and 0.1% or more.

Condition (TD2).

The condition (TD2) relates to the difference between the maximum expansion rate $E_{ATD}$ and the expansion rate at the end of heating $E_{BTD}$, i.e., $E_{ATD}-E_{BTD}$. From the viewpoint of forming an insulating layer having an excellent peel strength with respect to a conductive layer after a roughening treatment, even if using a resin composition having a high content of filler, when the insulating layer is formed by thermally curing a resin composition layer in a state that the support is attached to the resin composition layer, the difference $E_{ATD}-E_{BTD}$ is 0.5% or less, preferably 0.45% or less, more preferably 0.4% or less, still more preferably 0.35% or less, further more preferably 0.3% or less, 0.25% or less, 0.2% or less, and 0.15% or less. The lower limit of the difference $E_{ATD}-E_{BTD}$ is not particularly limited, and it may be 0%.

The expansion rate $E_{BTD}$ at the end of heating is not particularly limited so long as the $E_{BTD}$ satisfies the condition (TD2) in relationship with the maximum expansion rate $E_{ATD}$. The expansion rate at the end of heating $E_{BTD}$ is preferably 0.88% or less, more preferably 0.86% or less, still more preferably 0.84% or less, further more preferably 0.82% or less, 0.8% or less, 0.78% or less, 0.76% or less, 0.74% or less, 0.72% or less, and 0.7% or less. Although the lower limit of the $E_{BTD}$ is not particularly limited, it may be usually −0.2% or more, −0.1% or more, and 0% or more.

Referring again to FIGS. 1 to 3, the support shown in FIG. 1 satisfies both the conditions (TD1) and (TD2) when heated under the reference heating condition. It has been confirmed that, by using a support exhibiting such expansion characteristics, an insulating layer having an excellent peel strength with respect to a conductive layer after a roughening treatment can be formed, even if using a resin composition having a high content of filler, when the insulating layer is formed by thermally curing a resin composition layer in a state that the support is attached to the resin composition layer. In contrast, the support shown in FIG. 2 satisfies the condition (TD2) but does not satisfy the condition (TD1). The support shown in FIG. 3 satisfies the condition (TD1) but does not satisfy the condition (TD2). It has been confirmed that a support which does not satisfy one or both of the conditions (TD1) and (TD2) when heated under the reference heating condition is likely to result in an insulating layer having a poor peel strength with respect to a conductive layer after a roughening treatment, if using a resin composition having a high content of filler, when the insulating layer is formed by thermally curing a resin composition layer in a state that the support is attached to the resin composition layer.

The expansion-shrinkage characteristics of the support in the MD direction thereof is not particularly limited so long as the above conditions (TD1) and (TD2) are satisfied. With regard to the expansion-shrink characteristics of the support in the MD direction thereof, there will be shown two preferable embodiments that can take more benefit of the present invention.

In one preferable embodiment (hereinafter may be referred to as a "first embodiment"), when the support is heated under the reference heating condition, the support has an expansion rate $E_{BMD}$ of less than 0% in the MD direction thereof at the end of heating. In the first embodiment, the support shrinks in the MD direction under heating. In the first embodiment, the expansion rate at the end of heating $E_{BMD}$ is preferably −0.01% or less, more preferably −0.05% or less, still more preferably −0.1% or less, further more preferably −0.2% or less, −0.3% or less, −0.4% or less, −0.5% or less, −0.6% or less, −0.7% or less, −0.8% or less, −0.9% or less, and −1% or less. Although the lower limit of the $E_{BMD}$ is not particularly limited, it may be usually −2.0% or more and −1.9% or more.

In another preferable embodiment (hereinafter may be referred to as a "second embodiment"), when the support is heated under the reference heating condition, the support has an expansion rate $E_{BMD}$ of 0% or more in the MD direction thereof at the end of heating, and further satisfies the following conditions (MD1) and (MD2).

Condition (MD1): a maximum expansion rate $E_{AMD}$ (%) is equal to or less than $E_{ATD}$.

Condition (MD2): The difference between the maximum expansion rate $E_{AMD}$ (%) and the expansion rate at the end of heating $E_{BMD}$ (%), $E_{AMD}-E_{BMD}$, is 0.5% or less.

Regarding the condition (MD1), the maximum expansion rate $E_{AMD}$ is equal to or less than $E_{ATD}$, preferably $(E_{ATD}-0.02)$% or less, more preferably $(E_{ATD}-0.04)$% or less, still more preferably $(E_{ATD}-0.06)$% or less, further more preferably $(E_{ATD}-0.08)$% or less, $(E_{ATD}-0.1)$% or less, $(E_{ATD}-0.12)$% or less, $(E_{ATD}-0.14)$% or less, $(E_{ATD}-0.16)$% or less, $(E_{ATD}-0.18)$% or less, and $(E_{ATD}-0.2)$% or less. Although the lower limit of the maximum expansion rate $E_{ATD}$ is not particularly limited, it may be 0.0% or more and 0.1% or more.

Regarding the condition (MD2), the difference between the maximum expansion rate $E_{AMD}$ and the expansion rate at the end of heating $E_{BMD}$, $E_{AMD}-E_{BMD}$, is 0.5% or less, preferably 0.45% or less, more preferably 0.4% or less, still more preferably 0.35% or less, further more preferably 0.3% or less, 0.25% or less, 0.2% or less, and 0.15% or less. The lower limit of the difference $E_{AMD}-E_{BMD}$ is not particularly limited, and it may be 0%.

In the second embodiment, the expansion rate at the end of heating $E_{BMD}$ is not particularly limited so long as it is 0% or more and satisfies the condition (MD2) in relationship with the maximum expansion rate $E_{AMD}$.

For a support, a film formed of a plastic material (hereinafter may be simply referred to as a "plastic film") is preferably used because it is lightweight and has desired strength during production of a printed wiring board. Examples of the plastic material may include polyesters such as polyethylene terephthalate (hereinafter may be abbreviated as "PET") and polyethylene naphthalate (hereinafter may be abbreviated as "PEN"), polycarbonate (hereinafter may be abbreviated as "PC"), acrylics such as polymethyl methacrylate (PMMA), cyclic polyolefin, triacetylcellulose (TAC), polyether sulfide (PES), polyether ketone, and polyimide. Among them, polyethylene terephthalate and polyethylene naphthalate are preferable, and inexpensive polyethylene terephthalate is particularly preferable.

A conventional plastic film used for an adhesive sheet does not satisfy one or both of the conditions (TD1) and (TD2) when heated under the above reference heating condition. With such a conventional plastic film, a reduction in the peel strength between the formed insulating layer and a conductive layer tends to be significant, if using a resin composition having a high content of filler, when the insulating layer is formed by thermally curing a resin composition layer in a state that the support is attached to the resin composition layer.

In one preferable embodiment of the present invention, a plastic film is subjected to heat treatment (hereinafter may be referred to as "pre-heat treatment") to prepare a support that satisfies both the conditions (TD1) and (TD2). The conditions for the pre-heat treatment may be appropriately determined, so as to satisfy both the conditions (TD1) and (TD2), according to the types of the plastic material, whether or not stretching treatment has been performed during production of the support, the axial direction of the stretching treatment, the degree of stretching, etc.

In embodiment, the heating temperature of the pre-heat treatment is preferably (Tg+50°) C. or more, more preferably (Tg+60°) C. or more, still more preferably (Tg+70°) C. or more, further more preferably (Tg+80°) C. or more, and (Tg+90°) C. or more, where Tg is the glass transition temperature of the plastic film. The upper limit of the heating temperature is preferably (Tg+115°) C. or less, more preferably (Tg+110°) C. or less, and still more preferably (Tg+105°) C. or less, so long as it is lower than the melting point of the plastic film.

For example, in a case of a PET film, the heating temperature of the pre-heat treatment is preferably 130° C. or more, more preferably 140° C. or more, still more preferably 150° C. or more, further more preferably 160° C. or more, and 170° C. or more. The upper limit of the heating temperature is preferably 195° C. or less, more preferably 190° C. or less, and still more preferably 185° C. or less.

The heating time may be appropriately determined according to the heating temperature so as to satisfy both the conditions (TD1) and (TD2). In one embodiment, the heating time is preferably 1 minute or more, more preferably 2 minutes or more, still more preferably 5 minutes or more, and 10 minutes or more. The upper limit of the heating time varies depending on the heating temperature and is preferably 120 minutes or less, more preferably 90 minutes or less, and still more preferably 60 minutes or less.

The atmosphere during performing pre-heat is not particularly limited. Examples thereof may include an air atmosphere and an inert gas atmosphere (such as a nitrogen gas atmosphere, a helium atmosphere, and an argon atmosphere). An air atmosphere is preferable because the support can be easily prepared.

The pre-heat may be performed under any of reduced pressure, normal pressure, and increased pressure. Preferably, the pre-heating is performed under normal pressure because the support can be easily prepared.

For a support, a metal foil may also be used. Examples of the metal foil may include a copper foil and an aluminum foil, and a copper foil is preferable. As the copper foil, there may be used a foil formed of a single metal copper or a foil formed of an alloy of copper and another metal (such as tin, chromium, silver, magnesium, nickel, zirconium, silicon and titanium).

A surface of the support which is to be in contact with a resin composition layer described later may be subjected to a matte treatment or a corona treatment. As the support, there may also be used a support with a release layer which is a support having a release layer on its surface to be in contact with the resin composition layer. Examples of a release agent used for the release layer of the support with a release layer may include one or more release agents selected from the group consisting of an alkyd resin, a polyolefin resin, a urethane resin, and a silicone resin.

Although the thickness of the support is not particularly limited, the thickness is preferably in a range of 5 μm to 75 μm, more preferably in a range of 10 μm to 60 μm, and still more preferably in a range of 10 μm to 45 μm. When a support with a release layer is used, the total thickness of the support with a release layer preferably falls within the above range.

Resin Composition Layer.

A resin composition used for the resin composition layer is not particularly limited so long as a cured product thereof may have sufficient hardness and insulation properties. From the viewpoint of preventing occurrence of cracks and circuit distortion, which is caused by a difference in thermal expansion between the insulating layer and the conductive layer, by reducing the thermal expansion coefficient of the insulating layer, it is preferable that the resin composition used for the resin composition layer contains an inorganic filler.

As described above, the present inventors have found that a reduction in the peel strength between the formed insulating layer and a conductive layer tends to be significant, if using a resin composition having a high content of inorganic filler, when the insulating layer is formed by thermally curing a resin composition layer in a state that the support is attached to the resin composition layer. In this regard, the present invention, which uses a support satisfying the conditions (TD1) and (TD2) when heated under the above reference heating condition, is capable of forming an insulating layer having a good peel strength with respect to a conductive layer after a roughening treatment can be formed, even if using a resin composition having a high content of inorganic filler.

From the viewpoint of sufficiently reducing the thermal expansion coefficient of the insulating layer to be obtained, the content of the inorganic filler in the resin composition is preferably 50% by mass or more, more preferably 55% by mass or more, and still more preferably 60% by mass or more.

In the present invention, the content of each component constituting the resin composition is a value when the total mass of nonvolatile components in the resin composition is defined as 100% by mass.

In the present invention which uses a support satisfying the conditions (TD1) and (TD2) when heated under the above reference heating condition, the content of the inorganic filler can be further increased without a reduction in peel strength with respect to a conductive layer, even when the insulating layer is formed by thermally curing a resin composition layer in a state that the support is attached to the resin composition layer. For example, the content of the inorganic filler in the resin composition may be increased to 62% by mass or more, 64% by mass or more, 66% by mass or more, 68% by mass or more, 70% by mass or more, 72% by mass or more, 74% by mass or more, 76% by mass or more, or 78% by mass or more.

From the viewpoint of mechanical strength of the insulating layer to be obtained, the upper limit of content of the inorganic filler in the resin composition is preferably 95% by mass or less, more preferably 90% by mass or less, and still more preferably 85% by mass or less.

Examples of the inorganic filler may include silica, alumina, glass, cordierite, silicon oxide, barium sulfate, talc, clay, a mica powder, aluminum hydroxide, magnesium hydroxide, calcium carbonate, magnesium carbonate, magnesium oxide, boron nitride, aluminum nitride, manganese nitride, aluminum borate, barium titanate, strontium titanate, calcium titanate, magnesium titanate, bismuth titanate, titanium oxide, barium zirconate, calcium zirconate, zirconium phosphate, and zirconium phosphate tungstate. Among them, silica is particularly suitable, such as amorphous silica, fused silica, crystalline silica, synthetic silica, and hollow silica. Spherical silica is preferable as the silica. The inorganic filler may be used alone or in combination of two or more kinds thereof. Examples of commercially available spherical fused silica may include "SOC2" and "SOC1" manufactured by Admatechs Company Limited.

The average particle diameter of the inorganic filler used for the resin composition is preferably in a range of 0.01 µm to 5 µm, more preferably in a range of 0.05 µm to 2 µm, still more preferably in a range of 0.1 µm to 1 µm, and further more preferably in a range of 0.2 µm to 0.8 µm. The average particle diameter of the inorganic filler can be measured by a laser diffraction and scattering method on the basis of the Mie scattering theory. Specifically, the particle size distribution of the inorganic filler is prepared on the volume basis using a laser diffraction and scattering particle size distribution measuring device, and the median diameter thereof can be measured as an average particle diameter. As a measurement sample, there can be preferably used a dispersion in which the inorganic filler is dispersed in water by ultrasonification. As the laser diffraction and scattering particle size distribution measuring device, "LA-500" manufactured by HORIBA Ltd., or the like can be used.

From the viewpoint of increasing the humidity resistance and dispersibility, the inorganic filler is preferably treated with one or more kinds of surface treatment agents such as an aminosilane-based coupling agent, an epoxysilane-based coupling agent, a mercaptosilane-based coupling agent, a silane-based coupling agent, an organosilazane compound, and a titanate-based coupling agent. Examples of a commercially available surface treatment agent may include "KBM403" (3-glycidoxypropyltrimethoxysilane) manufactured by Shin-Etsu Chemical Co., Ltd., "KBM803" (3-mercaptopropyltrimethoxysilane) manufactured by Shin-Etsu Chemical Co., Ltd., "KBE903" (3-aminopropyltriethoxysilane) manufactured by Shin-Etsu Chemical Co., Ltd., "KBM573" (N-phenyl-3-aminopropyltrimethoxysilane) manufactured by Shin-Etsu Chemical Co., Ltd., and "SZ-31" (hexamethyldisilazane) manufactured by Shin-Etsu Chemical Co., Ltd.

The degree of surface treatment with the surface treatment agent can be evaluated based on the amount of carbon per unit surface area of the inorganic filler. From the viewpoint of improving dispersibility of the inorganic filler, the amount of carbon per unit surface area of the inorganic filler is preferably 0.02 mg/m$^2$ or more, more preferably 0.1 mg/m$^2$ or more, and still more preferably 0.2 mg/m$^2$ or more. In terms of preventing an increase in the melt viscosity of a resin varnish and the melt viscosity in a sheet form, the amount of carbon per unit surface area of the inorganic filler is preferably 1 mg/m$^2$ or less, more preferably 0.8 mg/m$^2$ or less, and still more preferably 0.5 mg/m$^2$ or less.

The amount of carbon per unit surface area of the inorganic filler can be measured after washing the inorganic filler which has been subjected to the surface treatment with a solvent (such as methyl ethyl ketone (MEK)). Specifically, a sufficient amount of MEK is added, as the solvent, to the inorganic filler the surface of which is treated with a surface treatment agent, and the resultant mixture is subjected to ultrasonic washing at 25° C. for 5 minutes. A supernatant liquid is removed and a solid content is dried. Thereafter, the amount of carbon per unit surface area of the inorganic filler can be measured with a carbon analyzer. As the carbon analyzer "EMIA-320V" manufactured by HORIBA Ltd., or the like can be used.

The resin composition used for the resin composition layer contains, as a resin, a thermosetting resin. As the thermosetting resin, there can be used any conventionally known thermosetting resins used for forming an insulating layer of a printed wiring board. Among them, an epoxy resin is preferable. The resin composition may further contain a curing agent, if necessary. In one embodiment, there can be used a resin composition containing the inorganic filler, an epoxy resin, and a curing agent. The resin composition used for the resin composition layer may further contain an additive such as a thermoplastic resin, an accelerator, a flame retardant, and a rubber particle.

Below are described the epoxy resin, curing agent, and additive which can be used for a material of the resin composition.

Epoxy Resin.

Examples of the epoxy resin may include a bisphenol A type epoxy resin, a bisphenol F type epoxy resin, a bisphenol S type epoxy resin, a bisphenol AF type epoxy resin, a dicyclopentadiene type epoxy resin, a trisphenol type epoxy resin, a naphthol novolac type epoxy resin, a phenol novolac type epoxy resin, a tert-butyl-catechol type epoxy resin, a naphthalene type epoxy resin, a naphthol type epoxy resin, an anthracene type epoxy resin, a glycidyl amine type epoxy resin, a glycidyl ester type epoxy resin, a cresol novolac type epoxy resin, a biphenyl type epoxy resin, a linear aliphatic epoxy resin, an epoxy resin having a butadiene structure, an alicyclic epoxy resin, a heterocyclic epoxy resin, a spiro ring-containing epoxy resin, a cyclohexanedimethanol type epoxy resin, a naphthylene ether type epoxy resin, and a trimethylol type epoxy resin. The epoxy resin may be used alone or in combination of two or more kinds thereof.

The epoxy resin preferably contains an epoxy resin having two or more epoxy groups within the molecule. It is preferable that at least 50% by mass of the epoxy resin is an epoxy resin having two or more epoxy groups within the molecule when a content of nonvolatile components in the epoxy resin is defined as 100% by mass. In particular, it is preferable that the epoxy resin contains an epoxy resin that has two or more epoxy groups within the molecule and is liquid at a temperature of 20° C. (hereinafter referred to as "liquid epoxy resin") and an epoxy resin that has three or more epoxy groups within the molecule and is solid at a temperature of 20° C. (hereinafter referred to as "solid epoxy resin"). When a liquid epoxy resin and a solid epoxy resin are used in combination as the epoxy resin, a resin composition having excellent flexibility can be obtained. Further, the rupture strength of an insulating layer formed by curing the resin composition is improved.

As the liquid epoxy resin, a bisphenol A type epoxy resin, a bisphenol F type epoxy resin, a phenol novolac type epoxy resin, or a naphthalene type epoxy resin is preferable, and a bisphenol A type epoxy resin, a bisphenol F type epoxy resin, or a naphthalene type epoxy resin is more preferable, and a bisphenol A type epoxy resin or a bisphenol F type epoxy resin is still more preferable. Specific examples of the liquid epoxy resin may include: "HP4032," "HP4032H," "HP4032D," and "HP4032SS" (naphthalene type epoxy resin) which are available from DIC Corporation; "jER828EL" (bisphenol A type epoxy resin), "jER807" (bisphenol F type epoxy resin), and "jER152" (phenol novolac type epoxy resin) which are available from Mitsubishi Chemical Corporation; "ZX1059" (a mixture of bisphenol A type epoxy resin and bisphenol F type epoxy resin) which is available from Nippon Steel & Sumikin Chemical Co., Ltd.; and "EX-721" (glycidyl ester type epoxy resin) which is available from Nagase ChemteX Corporation. The liquid epoxy resin may be used alone or in combination of two or more kinds thereof.

As the solid epoxy resin, a naphthalene type tetrafunctional epoxy resin, a cresol novolac type epoxy resin, a dicyclopentadiene type epoxy resin, a trisphenol type epoxy resin, a naphthol novolac type epoxy resin, a biphenyl type epoxy resin, or a naphthylene ether type epoxy resin is preferable, and a naphthalene type tetrafunctional epoxy resin, a biphenyl type epoxy resin, or a naphthylene ether type epoxy resin is more preferable, and a naphthalene type tetrafunctional epoxy resin or a biphenyl type epoxy resin is still more preferable. Specific examples of the solid epoxy resin may include: "HP-4700," "HP-4710" (naphthalene type tetrafunctional epoxy resin), "N-690" (cresol novolac type epoxy resin), "N-695" (cresol novolac type epoxy resin), "HP-7200" (dicyclopentadiene type epoxy resin), "EXA7311," "EXA7311-G3," "EXA7311-G4," "EXA7311-G4S," and "HP6000" (naphthylene ether type epoxy resin) which are available from DIC corporation; "EPPN-502H" (trisphenol epoxy resin), "NC7000L" (naphthol novolac epoxy resin), "NC3000H," "NC3000," "NC3000L," and "NC3100" (biphenyl type epoxy resin) which are available from Nippon Kayaku Co., Ltd.; "ESN475" (naphthol novolac type epoxy resin) and "ESN485V" (naphthol novolac type epoxy resin) which are available from Nippon Steel & Sumikin Chemical Co., Ltd.; "YX4000H," "YL6121" (biphenyl type epoxy resins), and "YX4000HK" (bixylenol type epoxy resin) which are available from Mitsubishi Chemical Corporation; "PG-100" and "CG-500" which are available from Osaka Gas Chemicals Co., Ltd.; and "YL7800" (fluorene type epoxy resin) which is available from Mitsubishi Chemical Corporation.

When the liquid epoxy resin and the solid epoxy resin are used in combination as the epoxy resin, a mass ratio thereof (liquid epoxy resin:solid epoxy resin) is preferably within a range of 1:0.1 to 1:5. When the mass ratio of the liquid epoxy resin to the solid epoxy resin falls within such a range, there may be obtained the following effects: i) moderate adhering properties can be obtained when the resin composition is used in an adhesive sheet form; ii) sufficient flexibility, which results in improvement in handleability, can be obtained when the resin composition is used in an adhesive sheet form; iii) an insulating layer having sufficient rupture strength can be obtained, and the like. From the viewpoints of the effects i) to iii) as noted above, the mass ratio of the liquid epoxy resin to the solid epoxy resin (liquid epoxy resin:solid epoxy resin) is more preferably in a range of 1:0.3 to 1:4, still more preferably in a range of 1:0.6 to 1:3, and particularly preferably in a range of 1:0.8 to 1:2.5.

The content of the epoxy resin in the resin composition is preferably 3% by mass to 50% by mass, more preferably 5% by mass to 45% by mass, still more preferably 5% by mass to 40% by mass, and further more preferably 7% by mass to 35% by mass.

The epoxy equivalent weight of the epoxy resin is preferably 50 to 3,000, more preferably 80 to 2,000, and still more preferably 110 to 1,000. When the epoxy equivalent weight falls within such a range, the crosslink density of a cured product becomes sufficient, and an insulating layer with small surface roughness can be provided. The epoxy equivalent weight can be measured according to JIS K7236, which is incorporated herein by reference in its entirety. The epoxy equivalent weight is the mass of the resin containing one equivalent of epoxy group.

The weight average molecular weight of the epoxy resin is preferably 100 to 5000, more preferably 250 to 3000, and still more preferably 400 to 1500. The weight average molecular weight of the epoxy resin is a polystyrene equivalent weight average molecular weight measured by gel permeation chromatography (GPC).

Curing Agent.

The curing agent is not particularly limited as long as it has a function of curing an epoxy resin. Examples thereof may include a phenol-based curing agent, a naphthol-based curing agent, an active ester-based curing agent, a benzoxazine-based curing agent, and a cyanate ester-based curing agent. The curing agent may be used alone or in combination of two or more kinds thereof.

From the viewpoints of heat resistance and water resistance, the phenol-based curing agent and the naphthol-based curing agent are preferably a phenol-based curing agent having a novolac structure and a naphthol-based curing agent having a novolac structure, respectively. From the viewpoint of adhesion to a conductive layer, a nitrogen-containing phenol-based curing agent is preferable, and a triazine skeleton-containing phenol-based curing agent is more preferable. Among them, a triazine skeleton-containing phenol novolac resin is preferable from the viewpoint of highly satisfying heat resistance, water resistance, and adhesion to a conductive layer (peel strength).

Specific examples of the phenol-based curing agent and the naphthol-based curing agent may include: "MEH-7700," "MEH-7810," and "MEH-7851" which are available from Meiwa Plastic Industries, Ltd.; "NHN," "CBN," and "GPH" which are available from Nippon Kayaku Co., Ltd.; "SN170," "SN180," "SN190," "SN475," "SN485," "SN495," "SN375," and "SN395" which are available from Tohto Kasei Co., Ltd.; and "LA7052," "LA7054," and "LA3018" which are available from DIC corporation.

From the viewpoint of obtaining an insulating layer exhibiting excellent peel strength with respect to a conductive layer, an active ester-based curing agent is also preferable. Although the active ester-based curing agent is not particularly limited, a compound having two or more highly reactive ester groups within the molecule is generally preferably used, such as phenol esters, thiophenol esters, N-hydroxyamine esters, and esters of heterocyclic hydroxy compounds. The active ester-based curing agent is preferably obtained by condensation reaction of a carboxylic acid compound and/or a thiocarboxylic acid compound with a hydroxy compound and/or a thiol compound. Particularly, from the viewpoint of enhancing the heat resistance, an active ester-based curing agent obtained from a carboxylic acid compound and a hydroxy compound is preferable, and an active ester-based curing agent obtained from a carboxylic acid compound and a phenol compound and/or a naphthol compound is more preferable. Examples of the carboxylic acid compound may include benzoic acid, acetic acid, succinic acid, maleic acid, itaconic acid, phthalic acid, isophthalic acid, terephthalic acid, and pyromellitic acid. Examples of the phenol compound or the naphthol compound may include hydroquinone, resorcinol, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzenone, trihydroxybenzophenone, tetrahydroxybenzophenone, phloroglucin, benzenetriol, a dicyclopentadiene-type diphenol compound, and phenol novolac. The above "dicyclopentadiene-type diphenol compound" is a diphenol compound obtained by condensation of one dicyclopentadiene molecule with two phenol molecules.

Specifically, an active ester compound containing a dicyclopentadiene-type diphenol structure, an active ester compound containing a naphthalene structure, an active ester compound containing an acetylated material of phenol novolac, and an active ester compound containing a benzoylated material of phenol novolac are preferable. Among them, an active ester compound containing a naphthalene structure and an active ester compound containing a dicyclopentadiene-type diphenol structure are more preferable. The "dicyclopentadiene-type diphenol structure" is a divalent structural unit of phenylene-dicyclopentalene-phenylene.

Examples of a commercially available product of the active ester-based curing agent may include: "EXB9451," "EXB9460," "EXB9460S," and "HPC-8000-65T" (available from DIC corporation) which are the active ester compound containing a dicyclopentadiene-type diphenol structure; "EXB9416-70BK" (available from DIC corporation) which is the active ester compound containing a naphthalene structure; "DC808" (available from Mitsubishi Chemical Corporation) which is the active ester compound containing an acetylated material of phenol novolac; and "YLH1026" (available from Mitsubishi Chemical Corporation) which is the active ester compound containing a benzoylated material of phenol novolac.

Specific examples of the benzoxazine-based curing agent may include: "HFB2006M" available from Showa Highpolymer Co., Ltd.; and "P-d" and "F-a" available from Shikoku Chemicals Corporation.

Examples of the cyanate ester-based curing agent may include: a difunctional cyanate resin such as bisphenol A dicyanate, polyphenolcyanate, oligo(3-methylene-1,5-phenylenecyanate), 4,4'-methylene bis(2,6-dimethylphenylcyanate), 4,4'-ethylidenediphenyldicyanate, hexafluorobisphenol A dicyanate, 2,2-bis(4-cyanate)phenylpropane, 1,1-bis(4-cyanatephenylmethane), bis(4-cyanate-3,5-dimethylphenyl)methane, 1,3-bis(4-cyanatephenyl-1-(methylethylidene))benzene, bis(4-cyanatephenyl)thioether, and bis(4-cyanatephenyl)ether; a polyfunctional cyanate resin derived from phenol novolac, cresol novolac, etc.; and a prepolymer in which these cyanate resins are partly triazinized. Specific examples of the cyanate ester-based curing agent may include "PT30" and "PT60" (both of which are a phenol novolac type polyfunctional cyanate ester resin) and "BA230" (a prepolymer in which bisphenol A dicyanate is partly or entirely triazinized to form a trimer) which are available from Lonza Japan Ltd.

The quantitative ratio of the epoxy resin to the curing agent, in terms of a ratio of [the total number of epoxy groups in the epoxy resin]:[the total number of reactive groups in the curing agent], is preferably within a range of 1:0.2 to 1:2, more preferably within a range of 1:0.3 to 1:1.5, and still more preferably within a range of 1:0.4 to 1:1.2. The reactive group of the curing agent is an active hydroxyl group, an active ester group, or the like, and differs depending on the kind of the curing agent. The total number of epoxy groups in the epoxy resin is a value obtained by dividing the mass of solid content in each epoxy resin by respective epoxy equivalent weights and summing the calculated values for all epoxy resins. The total number of reactive groups in the curing agent is a value obtained by dividing the mass of solid content in each curing agent by respective reactive group equivalent weights and summing the calculated values for all curing agents. When the quantitative ratio of the epoxy resin to the curing agent falls within such a range, the heat resistance of the cured product of the resin composition would be more improved.

In one embodiment, the resin composition contains the inorganic filler, the epoxy resin, and the curing agent as described above. Preferably, the resin composition contains silica as the inorganic filler, a mixture of a liquid epoxy resin and a solid epoxy resin (the mass ratio of the liquid epoxy resin to the solid epoxy resin is preferably in a range of 1:0.1 to 1:5, more preferably in a range of 1:0.3 to 1:4, still more preferably in a range of 1:0.6 to 1:3, and further more preferably in a range of 1:0.8 to 1:2.5) as the epoxy resin, and one or more selected from the group consisting of a phenol-based curing agent, a naphthol-based curing agent, an active ester-based curing agent, and a cyanate ester-based curing agent (preferably one or more selected from the group consisting of a phenol-based curing agent, a naphthol-based curing agent, and an active ester-based curing agent) as the curing agent. With regard also to a resin composition containing a combination of such particular components, suitable contents of the inorganic filler, the epoxy resin and the curing agent are as described above. In particular, it is preferable that the content of the inorganic filler is 50% by mass to 95% by mass and the content of the epoxy resin is 3% by mass to 50% by mass, and it is more preferable that the content of the inorganic filler is 50% by mass to 90% by mass and the content of the epoxy resin is 5% by mass to 45% by mass. As for the content of the curing agent, the curing agent is preferably contained in the resin composition such that the ratio of the total number of epoxy groups in the epoxy resin to the total number of reactive groups in the curing agent is preferably in a range of 1:0.2 to 1:2, more preferably in a range of 1:0.3 to 1:1.5, and still more preferably in a range of 1:0.4 to 1:1.2.

Thermoplastic Resin.

The resin composition may further contain a thermoplastic resin. Examples of the thermoplastic resin may include a phenoxy resin, a polyvinyl acetal resin, a polyolefin resin, a polybutadiene resin, a polyimide resin, a polyamide-imide resin, a polyethersulfone resin, a polyphenylene ether resin, and a polysulfone resin. The thermoplastic resin may be used alone or in combination of two or more kinds thereof.

The polystyrene equivalent weight average molecular weight of the thermoplastic resin is preferably in a range of 8,000 to 70,000, more preferably in a range of 10,000 to 60,000, and still more preferably in a range of 20,000 to 60,000. The polystyrene equivalent weight average molecular weight of the thermoplastic resin is measured by gel permeation chromatography (GPC). Specifically, the polystyrene equivalent weight average molecular weight of the thermoplastic resin can be determined at a column temperature of 40° C. using LC-9A/RID-6A manufactured by Shimadzu Corporation as a measurement apparatus, Shodex K-800P/K-804L/K-804L manufactured by Showa Denko K.K. as columns, and chloroform or the like as a mobile phase, and carrying out calculation using a calibration curve of standard polystyrene.

Examples of the phenoxy resin may include phenoxy resins having one or more skeletons selected from the group consisting of a bisphenol A skeleton, a bisphenol F skeleton, a bisphenol S skeleton, a bisphenol acetophenone skeleton, a novolac skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethylcyclohexane skeleton. A terminal of phenoxy resin may be any functional group such as a phenolic hydroxyl group and an epoxy group. The phenoxy resin may be used alone or in combination of two or more kinds thereof. Specific examples of the phenoxy resin may include "1256" and "4250" (both of which are a bisphenol A skeleton-containing phenoxy resin), "YX8100" (a bisphenol S skeleton-containing phenoxy resin), and "YX6954" (a bisphenol acetophenone skeleton-containing phenoxy resin) which are available from Mitsubishi Chemical Corporation. Additional examples thereof may include "FX280" and "FX293" which are available from Tohto Kasei Co., Ltd., and "YL7553," "YL6794," "YL7213," "YL7290," and "YL7482" which are available from Mitsubishi Chemical Corporation.

Specific examples of the polyvinyl acetal resin may include denkabutyral 4000-2, 5000-A, 6000-C, and 6000-EP which are available from DENKI KAGAKU KOGYO KABUSHIKI KAISHA, and S-LEC BH series, BX series, KS series, BL series, and BM series which are available from SEKISUI CHEMICAL CO., LTD.

Specific examples of the polyimide resin may include "RIKACOAT SN20" and "RIKACOAT PN20" which are available from New Japan Chemical Co., Ltd. Additionally, specific examples of the polyimide resin may include modified polyimides such as a linear polyimide obtained by reaction of a difunctional hydroxyl-terminated polybutadiene, a diisocyanate compound and a tetrabasic acid anhydride (described in JP-A-2006-37083), and a polysiloxane skeleton-containing polyimide (described in JP-A-2002-12667 and JP-A-2000-319386).

Specific examples of the polyamide-imide resin may include "VYLOMAX HR11NN" and "VYLOMAX HR16NN" which are available from TOYOBO CO., LTD. Additionally, specific examples of the polyamide-imide resin may include modified polyamide-imides such as polysiloxane skeleton-containing polyamide-imide "KS9100" and "KS9300" which are available from Hitachi Chemical Company, Ltd.

Specific examples of the polyethersulfone resin may include "PES5003P" available from Sumitomo Chemical Co., Ltd.

Specific examples of the polysulfone resin may include polysulfones "P1700" and "P3500" which are available from Solvay Advanced Polymers K.K.

The content of the thermoplastic resin in the resin composition is preferably 0.1% by mass to 20% by mass. When the content of the thermoplastic resin falls within such a range, the viscosity of the resin composition is moderate, and therefore a resin composition having uniform thickness and uniform bulk properties can be formed. The content of the thermoplastic resin in the resin composition is more preferably 0.3% by mass to 10% by mass.

Accelerator.

The resin composition may further contain an accelerator. Examples of the accelerator may include a phosphorus-based accelerator, an amine-based accelerator, an imidazole-based accelerator, and a guanidine-based accelerator. Among them, a phosphorus-based accelerator, an amine-based accelerator, and an imidazole-based accelerator are preferable. The accelerator may be used alone or in combination of two or more kinds thereof.

Examples of the phosphorus-based accelerator may include triphenylphosphine, a phosphonium borate compound, tetraphenylphosphonium tetraphenylborate, n-butylphosphonium tetraphenylborate, tetrabutylphosphonium decanoate, (4-methylphenyl)triphenylphosphonium thiocyanate, tetraphenylphosphonium thiocyanate, and butyltriphenylphosphonium thiocyanate. Of these, triphenylphosphine and tetrabutylphosphonium decanoate are preferable.

Examples of the amine-based accelerator may include: trialkylamine such as triethylamine and tributylamine; 4-dimethylaminopyridine; benzyldimethylamine; 2,4,6,-tris(dimethylaminomethyl)phenol, and 1,8-diazabicyclo(5,4,0)-undecene. Of these, 4-dimethylaminopyridine and 1,8-diazabicyclo(5,4,0)-undecene are preferable.

Examples of the imidazole-based accelerator may include: an imidazole compound such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'- undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, and 2-phenylimidazoline; and an adduct of an imidazole compound and an epoxy resin. Of these, 2-ethyl-4-methylimidazole and 1-benzyl-2-phenylimidazole are preferable.

Examples of the guanidine-based accelerator may include dicyandiamide, 1-methylguanidine, 1-ethylguanidine, 1-cyclohexylguanidine, 1-phenylguanidine, 1-(0-tolyl)guanidine, dimethylguanidine, diphenylguanidine, trimethylguanidine, tetramethylguanidine, pentamethylguanidine, 1,5,7-triazabicyclo[4.4.0]dec-5-ene, 7-methyl-1,5,7-triazabicyclo[4.4.0]dec-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl)biguanide. Of these, dicyandiamide and 1,5,7-triazabicyclo(4.4.01dec-5-ene are preferable.

The content of the accelerator in the resin composition is not particularly limited. Preferably, the accelerator is used so that the content thereof falls within a range of 0.05% by mass to 3% by mass when the total content of nonvolatile components in the epoxy resin and the curing agent is defined as 100% by mass.

Flame Retardant.

The resin composition may further contain a flame retardant. Examples of the flame retardant may include an organic phosphorus-based flame retardant, an organic nitrogen-containing phosphorus compound, a nitrogen compound, a silicone-based flame retardant, and a metal hydroxide. The flame retardant may be used alone or in combination of two or more kinds thereof. Although the content of the flame retardant in the resin composition is not particularly limited, it is preferably 0.5% by mass to 20% by mass, more preferably 1% by mass to 15% by mass, and still more preferably 1.5% by mass to 10% by mass.

Rubber Particles.

The resin composition may further contain rubber particles. The rubber particles which may be used in the present invention are, for example, one which is insoluble in an organic solvent used for preparing a resin varnish described below and is incompatible with the above epoxy resin, curing agent and thermoplastic resin. In general, such rubber particles can be prepared by increasing the molecular weight of a rubber component to such an extent that it is insoluble in the solvent and the resin, and converting it into a granular state.

Examples of the rubber particles may include a core-shell type rubber particle, a crosslinked acrylonitrile butadiene rubber particle, a crosslinked styrene butadiene rubber particle, and an acrylic rubber particle. The core-shell type rubber particle is a rubber particle having a core layer and a shell layer, and examples thereof may include a two-layer structure in which the shell layer as an external layer is made of a glassy polymer and the core layer as an internal layer is made of a rubbery polymer; and a three-layer structure in which the shell layer as an external layer is made of a glassy polymer, an intermediate layer is made of a rubbery polymer, and the core layer is made of a glassy polymer. The glassy polymer layer is made of, for example, a methyl methacrylate polymer, and the rubbery polymer layer is made of, for example, a butyl acrylate polymer (butyl rubber). Each type of rubber particles may be used alone or in combination of two or more kinds thereof.

The average particle diameter of the rubber particles is preferably within a range of 0.005 μm to 1 μm, and more preferably within a range of 0.2 μm to 0.6 μm. The average particle diameter of the rubber particles can be measured using a dynamic light scattering method. For example, the measurement can be carried out by uniformly dispersing the rubber particles in an appropriate organic solvent by ultrasonic wave or the like, preparing the particle size distribution of the rubber particle using a concentrated system particle size analyzer (FPAR-1000, manufactured by Otsuka Electronics Co., Ltd.) on the mass basis, and defining its median diameter as the average particle diameter. The content of the rubber particle in the resin composition is preferably 1% by mass to 20% by mass, more preferably 2% by mass to 10% by mass, and still more preferably 2% by mass to 5% by mass.

Other Components.

The resin composition may contain one or more other additives, if necessary. Examples of the other additives may include an organometallic compound such as an organic copper compound, an organic zinc compound and an organic cobalt compound, and a resin additive such as an organic filler, a thickener, an antifoaming agent, a leveling agent, an adhesion-imparting agent, and a coloring agent.

The thickness of the resin composition layer is not particularly limited. From the viewpoint of making a printed wiring board thinner, the thickness of the resin composition layer is preferably 5 μm to 100 μm, more preferably 10 μm to 90 μm, and still more preferably 15 μm to 80 μm.

The adhesive sheet can be produced by, for example, preparing a resin varnish in which a resin composition is dissolved in an organic solvent, applying the resin varnish onto a support with a die coater or the like, and drying the resin varnish to form a resin composition layer.

Examples of the organic solvent may include: ketones such as acetone, methyl ethyl ketone and cyclohexanone; acetates such as ethyl acetate, butyl acetate, cellosolve acetate, propylene glycol monomethyl ether acetate and carbitol acetate; carbitols such as cellosolve and butyl carbitol; aromatic hydrocarbons such as toluene and xylene; and amide-based solvents such as dimethylformamide, dimethylacetamide and N-methylpyrrolidone. The organic solvent may be used alone or in combination of two or more kinds thereof.

The resin varnish may be dried by a known drying method such as heating and blowing hot air. The drying conditions are not particularly limited, but the resin varnish is dried such that the content of the organic solvent in the resin composition layer (the remaining solvent content) is 10% by mass or less and preferably 5% by mass or less. From the viewpoint of handleability of the resin composition layer and of prevention of an increase in melt viscosity in a sheet form, the remaining solvent content is preferably 0.5% by mass or more and more preferably 1% by mass or more. Drying conditions vary depending on the boiling point of the organic solvent in the resin varnish. For example, when a resin varnish containing an organic solvent of 30% by mass to 60% by mass is used, the resin varnish can be dried at 50° C. to 150° C. for 3 to 10 minutes to form a resin composition layer.

In the adhesive sheet, a protective film corresponding to the support can be further laminated on the surface of the resin composition layer with which the support is not in contact (that is, the surface on a side opposite to the support). Although the thickness of the protective film is not particularly limited, it is, for example, 1 μm to 40 μm. When the protective film is laminated, attachment of dust or the like or generation of scratch on the surface of the resin composition layer can be prevented. The adhesive sheet can be wound into a roll form and stored. In production of a printed wiring board, the adhesive sheet can be used by peeling off the protective film.

Method for Producing Printed Wiring Board.

The method for producing a printed wiring board of the present invention includes the following steps (A) to (C) in this order:

(A) laminating, onto an internal layer substrate, an adhesive sheet which includes a support and a resin composition layer in contact with the support, so that the resin composition layer is in contact with the internal layer substrate;

(B) thermally curing the resin composition layer to form an insulating layer; and (C) removing the support, wherein when the support is heated under the following heating condition, the support satisfies the following conditions (TD1) and (TD2) in a TD direction thereof, Heating condition: a temperature is increased from 20° C. to 100° C. at a rate of 8° C./minute, maintained at 100° C. for 30 minutes, then increased to 180° C. at a rate of 8° C./minute, and maintained at 180° C. for 30 minutes, Condition (TD1): a maximum expansion rate $E_{ATD}$ (%) is 0.9% or less, and Condition (TD2): a difference between the maximum expansion rate $E_{ATD}$ (%) and an expansion rate at the end of heating $E_{BTD}$ (%) $E_{ATD}-E_{BTD}$, 0.5% or less.

The phrase "comprises (comprising) steps in this order" or "includes (including) steps in this order" used in reference to the steps (A) to (C) in the present invention is not intended to prevent other steps from being included as long as each of the steps (A) to (C) is included and the steps (A) to (C) are performed in this order.

Hereinafter, the same shall apply to the phrase "comprises (comprising) in this order" or "includes (including) in this order" used in reference to the steps or the processes.

Step (A).

In the step (A), the adhesive sheet which includes a support and a resin composition layer in contact with the support is laminated onto an internal layer substrate so that the resin composition layer is in contact with the internal layer substrate.

The adhesive sheet used in the step (A) is as described in the section of Adhesive sheet. The adhesive sheet is characterized by including the support that satisfies the conditions (TD1) and (TD2) when heated under the heating condition (the reference heating condition) as described above.

The "internal layer substrate" used in the step (A) refers mainly to: a substrate such as a glass epoxy substrate, a metal substrate, a polyester substrate, a polyimide substrate, a BT resin substrate and a thermosetting polyphenylene ether substrate; and a circuit substrate in which a patterned conductive layer (circuit) is formed on one side or both sides of the above substrate. The "internal layer substrate" in the present invention also includes an internal layer circuit substrate that is an intermediate product on which an insulating layer and/or a conductive layer is further to be formed in the production of a printed wiring board.

The lamination of the adhesive sheet and the internal layer substrate can be performed by, for example, thermal pressing the adhesive sheet, from the support side, to the internal layer substrate. Examples of a member used for thermal pressing the adhesive sheet to the internal layer substrate (hereinafter referred to as a "thermal pressing member") may include a heated metal plate (such as a SUS flat panel), a heated metal roller (SUS roller), and the like. The thermal pressing member is preferably pressed against the adhesive sheet in a state that an elastic material such as heat resistant rubber intervenes therebetween so as to allow the adhesive sheet to sufficiently follow the surface irregularities of the internal layer substrate, instead of directly pressing the thermal pressing member against the adhesive sheet.

The thermal pressing temperature is preferably in a range of 80° C. to 160° C., more preferably in a range of 90° C. to 140° C., and still more preferably in a range of 100° C. to 120° C. The thermal pressing pressure is preferably in a range of 0.098 MPa to 1.77 MPa and more preferably in a range of 0.29 MPa to 1.47 MPa. The thermal pressing time is preferably in a range of 20 seconds to 400 seconds and more preferably in a range of 30 seconds to 300 seconds. The lamination is preferably performed under a reduced pressure condition of a pressure of 26.7 hPa or less.

The lamination can be performed using a commercially available vacuum laminator. Examples of the commercially available vacuum laminator may include a vacuum pressure laminator manufactured by Meiki Co., Ltd., and a vacuum applicator manufactured by Nichigo-Morton Co., Ltd.

After the lamination, the laminated adhesive sheet may be subjected to a smoothing treatment by, for example, pressing the thermal pressing member, from the support side, to the laminated adhesive sheet under normal pressure (atmospheric pressure). The pressing conditions for the smoothing treatment may be the same as the thermal pressing conditions for the lamination described above. The smoothing treatment can be performed using a commercially available vacuum laminator. The lamination and the smoothing treatment may be performed continuously using the commercially available vacuum laminator.

Step (B).

In the step (B), the resin composition layer is thermally cured to form an insulating layer.

The conditions for thermally curing the resin composition layer are not particularly limited, and there may be used a condition which is generally used in formation of an insulating layer of a printed wiring board.

The condition for thermally curing the resin composition layer varies depending on the chemical composition of the resin composition constituting the resin composition layer. For example, the curing temperature may be in a range of 150° C. to 240° C. (preferably 155° C. to 230° C., more preferably 160° C. to 220° C., still more preferably 170° C. to 210° C., and further more preferably 180° C. to 200° C.), and the curing time may be in ae range of 5 minutes to 100 minutes (preferably 10 minutes to 80 minutes and more preferably 10 minutes to 50 minutes). The thermal curing may be performed under any of normal pressure, reduced pressure, and increased pressure.

From the viewpoint of forming an insulating layer exhibiting excellent peel strength with respect to a conductive layer after a roughening treatment even if using a resin composition having a high content of inorganic filler, it is preferable that the step (B) include: heating the resin composition layer at a temperature $T_1$; and then thermally curing the resin composition layer at a temperature $T_2$ which is higher than the temperature $T_1$.

In one preferable embodiment, the step (B) includes the following steps in this order:

(i) heating the resin composition layer at a temperature $T_1$ (50° C.≤$T_1$<150° C.); and (II) thermally curing the heated resin composition layer at a temperature $T_2$ (150° C.≤$T_2$≤240° C.).

In the heating of (i) above, the temperature $T_1$ varies depending on the chemical composition of the resin composition layer, and it satisfies preferably 60° C.≤$T_1$≤130° C., more preferably 70° C.≤$T_1$≤120° C., still more preferably 80° C.≤$T_1$≤110° C., and further more preferably 80° C.≤$T_1$≤100° C.

The time for heating at the temperature $T_1$ varies depending on the temperature $T_1$, and it is preferably 10 minutes to 150 minutes, more preferably 15 minutes to 120 minutes, and still more preferably 20 minutes to 120 minutes.

The heating of (i) may be performed under any of normal pressure, reduced pressure, and increased pressure. From the viewpoint of forming an insulating layer exhibiting excellent peel strength with respect to a conductive layer after a roughening treatment, it is preferable that the heating is performed at an air pressure in a range of preferably 0.075 mmHg to 3751 mmHg (0.1 hPa to 5,000 hPa) and more preferably in a range of 1 mmHg to 1,875 mmHg (1.3 hPa to 2,500 hPa).

In the thermal curing of (ii) above, the temperature $T_2$ varies depending on the chemical composition of the resin composition layer, and it satisfies preferably 155° C.≤$T_2$≤230° C., more preferably 160° C.≤$T_2$≤220° C., still more preferably 170° C.≤$T_2$≤210° C., and further more preferably 180° C.≤$T_2$≤200° C.

The temperature $T_1$ and the temperature $T_2$ satisfy preferably the relation 20° C.≤$T_2$-$T_1$≤150° C., more preferably 30° C.≤$T_2$-$T_1$≤140° C., still more preferably 40° C.≤$T_2$-$T_1$≤130° C., and particularly preferably 50° C.≤$T_2$-$T_1$≤120° C.

The time for thermally curing at the temperature $T_2$ varies depending on the temperature $T_2$, and it is preferably 5 minutes to 100 minutes, more preferably 10 minutes to 80 minutes, and still more preferably 10 minutes to 50 minutes.

The thermal curing of (ii) may be performed under any of normal pressure, reduced pressure, and increased pressure. It is preferable that the thermal curing is performed at the same air pressure as the heating step.

After the heating of (i), the resin composition layer may be cooled, and then the thermal curing of (ii) may be performed. Alternatively, the thermal curing of (ii) may be performed after the heating of (i) without cooling the resin composition layer. In one preferable embodiment, the step (B) further includes, between the heating of (i) and the thermal curing of (ii), increasing a temperature from $T_1$ to $T_2$. In this embodiment, the rate of increasing a temperature from the temperature $T_1$ to the temperature $T_2$ is preferably 1.5° C./minute to 30° C./minute, more preferably 2° C./minute to 30° C./minute, still more preferably 4° C./minute to 20° C./minute, and further more preferably 4° C./minute to 10° C./minute. Thermal curing of the resin composition layer may be started during increasing a temperature.

As described in detail later, the insulating layer obtained in the step (B) has, near its surface in contact with the support, a phase in which substantially only a resin component is present, even when using a resin composition having a high content of inorganic filler.

Step (C).

In the step (C), the support is removed.

The support may be removed by peeling manually or peeling mechanically using an automated peeling device. When a metal foil is used as the support, the support may be removed by etching with a chemical agent.

In the step (C), the surface of the insulating layer is exposed. In the present method in which the step (B) is performed while the support exhibiting the specific expansion characteristics remains attached, the present inventors have confirmed that, even when using a resin composition having a high content of inorganic filler, substantially no inorganic filler is present on the exposed surface of the insulating layer. In one embodiment, in the insulating layer obtained by the present method, the distance from a surface of the insulating layer (the surface in contact with the support) to an edge point of the inorganic filler that is closest to the surface (an edge point in the insulating layer surface side) (i.e., the thickness of the phase in which only a resin component is present; this thickness is hereinafter referred to as an "surface resin thickness of insulating layer") is preferably 150 nm or more, more preferably 170 nm or more, still more preferably 190 nm or more, further more preferably 200 nm or more, 220 nm or more, 240 nm or more, 260 nm or more, 280 nm or more, and 300 nm or more. Although the upper limit of the surface resin thickness of insulating layer is not particularly limited, it may be generally 2 μm or less, 1.5 μm or less, etc. The surface resin thickness of insulating layer can be determined by performing a SEM observation for a cross section in thickness direction of the insulating layer obtained in the step (C). Examples of a focused ion beam/scanning ion microscope that can be used for the SEM observation may include "SU-1500" manufactured by Hitachi High-Technologies Corporation and "SMI3050SE" manufactured by SII NanoTechnology Inc.

When a printed wiring board is produced, there may be further performed the following steps of (D) perforating the insulating layer, (E) performing a roughening treatment of the insulating layer, and (F) forming a conductive layer on a surface of the insulating layer. These steps (D) to (F) may be performed using any methods which are known to those skilled in the art in the production of a printed wiring board.

The step (D) is a step of perforating the insulating layer. By performing the step (D), holes such as via-holes and through holes can be formed in the insulating layer. For example, the holes can be formed in the insulating layer using a drill, a laser (a carbon dioxide gas laser, a YAG laser, etc.), plasma, etc. The step (D) may be performed between the steps (B) and (C) or may be performed after the step (C).

The step (E) is a step of performing a roughening treatment of the insulating layer. The procedure and conditions for the roughening treatment are not particularly limited, and there can be used a known procedure and conditions which are generally used in formation of an insulating layer of a printed wiring board. The roughening treatment of the insulating layer can be performed by, for example, carrying out a swelling treatment with a swelling solution, a roughening treatment with an oxidant, and neutralization treatment with a neutralization solution in this order. The swelling solution is not particularly limited, and examples thereof may include an alkaline solution and a surfactant solution. Among them, an alkaline solution is preferable, and the alkaline solution is preferably a sodium hydroxide solution or a potassium hydroxide solution. Examples of a commercially available swelling solution may include Swelling Dip Securiganth P and Swelling Dip Securiganth SBU, available from Atotech Japan K. K. The swelling treatment with a swelling solution is not particularly limited, and it can be carried out by, for example, immersing the insulating layer into the swelling solution at 30° C. to 90° C. for 1 minute to 20 minutes. The oxidant is not particularly limited, and examples thereof may include an alkaline permanganate solution in which potassium permanganate or sodium permanganate is dissolved in an aqueous solution of sodium hydroxide. The roughening treatment with an oxidant such as an alkaline permanganate solution is preferably performed by immersing the insulating layer into the oxidant solution at 60° C. to 80° C. for 10 minutes to 30 minutes. The concentration of permanganate in an alkaline permanganate solution is preferably 5% by mass to 10% by mass. Examples of a commercially available oxidant may include an alkaline permanganate solution such as Concentrate Compact CP and Dosing Solution Securiganth P available from Atotech Japan K. K. The neutralization solution is preferably an acidic aqueous solution. Examples of a commercially available neutralization solution may include Reduction Solution Securiganth P available from Atotech Japan K. K. The treatment with the neutralization solution may be carried out by immersing the treated surface subjected to the roughening treatment with the oxidant solution into the neutralization solution at 30° C. to 80° C. for 5 minutes to 30 minutes.

In conventional techniques including the above-described WO 2010/35451, the inorganic filler present on the surface of the insulating layer is detached during a roughening treatment, and irregularities are thereby formed on the surface of the insulating layer. These irregularities may exhibit an anchor effect with respect to a conductive layer and contribute to an improvement in the peel strength between the insulating layer and the conductive layer. However, when the content of the inorganic filler in the insulating layer is high, a reduction in the peel strength between the insulating layer and the conductive layer may be unavoidable even with the anchor effect by the irregularities. Further, the surface roughness of the insulating layer may become excessively high after the roughening treatment, or variations in the surface roughness of the insulating layer may occur.

The insulating layer obtained in the present method has, near its surface, a phase in which substantially only a resin component is present, even when using a resin composition having a high content of inorganic filler, as described above. Thus, in the insulating layer formed by the present method, the occupancy ratio of the inorganic filler is low in a region near the surface, while maintaining the feature of high content of inorganic filler. Therefore, in the insulating layer formed by the present method, the detachment of the inorganic filler during the roughening treatment is less likely to occur than in the insulating layers in the conventional techniques. The insulating layer formed by the present method exhibits excellent peel strength with respect to a conductive layer after the roughening treatment. This may be because a surface that contributes to the peel strength with respect to a conductive layer can be produced in a balance between the content of the inorganic filler and the detachment of the inorganic filler.

In one embodiment, the arithmetic average roughness Ra of the surface of the insulating layer after the roughening treatment is preferably 300 nm or less, more preferably 280 nm or less, still more preferably 260 nm or less, and further more preferably 240 nm or less. The insulating layer formed by the present method exhibits excellent peel strength with respect to a conductive layer even when the Ra is low as described above. Although the lower limit of Ra is not particularly limited, it may be generally 0.5 nm or more, 1 nm or more, etc. When the Ra of the surface of the insulating layer after the roughening treatment is non-uniform, it is preferable that the maximum value of Ra ($Ra_{max}$) is within the above range.

With the present method, an insulating layer with small variations in surface roughness after the roughening treatment can be formed. In one embodiment, a difference between a maximum value ($Ra_{max}$) and minimum value ($Ra_{min}$) of the arithmetic mean roughness of the surface of the insulating layer after the roughening treatment, i.e., $Ra_{max}$-$Ra_{min}$, is preferably lower than 100 nm, more preferably 80 nm or less, still more preferably 60 nm or less, further more preferably 50 nm or less, 40 nm or less, and 30 nm or less. It is preferable that the lower limit of the difference $Ra_{max}$-$Ra_{min}$ is low. The difference may be 0 nm and is usually 0.1 nm or more, 0.5 nm or more, etc.

The arithmetic average roughness Ra of the surface of the insulating layer can be measured using a non-contact type surface roughness meter. Specific examples of the non-contact type surface roughness meter may include "WYKO GT-X3" and "WYKO NT3300" manufactured by Veeco Instruments Inc.

The step (F) is a step of forming a conductive layer on a surface of the insulating layer.

A conductive material used for the conductive layer is not particularly limited. In a preferred embodiment, the conductive layer contains one or more metals selected from the group consisting of gold, platinum, palladium, silver, copper, aluminum, cobalt, chromium, zinc, nickel, titanium, tungsten, iron, tin, and indium. The conductive layer may be a single metal layer or an alloy layer. Examples of the alloy layer may include layers formed of an alloy of two or more metals selected from the above-described group (for example, a nickel-chromium alloy, a copper-nickel alloy, and a copper-titanium alloy). In particular, from the viewpoints of versatility and cost of forming a conductive layer and ease of patterning, the conductive layer is preferably a single metal layer of chromium, nickel, titanium, aluminum, zinc, gold, palladium, silver or copper, or an alloy layer of a nickel-chromium alloy, a copper-nickel alloy or a copper-titanium alloy, and more preferably a single metal layer of chromium, nickel, titanium, aluminum, zinc, gold, palladium, silver or copper, or an alloy layer of a nickel-chromium alloy, and still more preferably a single metal layer of copper.

The conductive layer may have a single-layer structure or a multiple-layered structure in which two or more layers of a single metal layer or an alloy layer formed of different kinds of metals or alloy are layered. When the conductive layer has a multiple-layered structure, it is preferable that a layer in contact with the insulating layer is a single metal layer of chromium, zinc or titanium, or an alloy layer of a nickel-chromium alloy.

Although the thickness of the conductive layer depends on a desired design of a printed wiring board, it is usually 3 µm to 35 µm, and preferably 5 µm to 30 µm.

The conductive layer may be formed by plating. For example, a conductive layer having a desired wiring pattern can be formed by plating the surface of the insulating layer using a conventionally known technique such as a semi-additive method and a full-additive method. Hereinafter, an example of forming a conductive layer by the semi-additive method will be shown.

Firstly, a plating seed layer is formed on the surface of the insulating layer by electroless plating. Subsequently, on the formed plating seed layer, a mask pattern is formed that exposes a portion of the plating seed layer corresponding to desired wiring pattern. A metal layer is formed on the exposed plating seed layer by electrolytic plating, and then the mask pattern is removed. After that, an unnecessary plating seed layer can be removed by etching or the like to form a conductive layer having desired wiring pattern.

In one embodiment, the peel strength between the insulating layer and the conductive layer after the roughening treatment is preferably 0.4 kgf/cm or more, more preferably 0.45 kgf/cm or more, still more preferably 0.5 kgf/cm or more, further more preferably 0.55 kgf/cm or more, or 0.6 kgf/cm or more. Although the upper limit of the peel strength is not particularly limited, it may be 1.2 kgf/cm or less, 0.9 kgf/cm or less, etc. In the present invention, there can be formed an insulating layer exhibiting such a high peel strength, despite that the surface roughness Ra of the insulating layer after the roughening treatment is low. Together with the fact that variations in surface roughness Ra of the insulating layer after the roughening treatment are small (i.e., the difference $Ra_{max}-Ra_{min}$ is low), the present method significantly contributes to microfabrication of wirings of a printed wiring board.

In the present invention, the peel strength between the insulating layer and the conductive layer is a peel strength (90 degree peel strength) when the conductive layer is peeled off from the insulating layer in a direction perpendicular to the insulating layer (in a 90 degree direction). The peel strength between the insulating layer and the conductive layer can be determined by measuring the peel strength when the conductive layer is peeled off from the insulating layer in the direction perpendicular to the insulating layer (in the 90 degree direction) using a tensile testing device. Examples of the tensile testing device may include "AC-50C-SL" manufactured by TSE Co., Ltd.

Plastic Film.

The present invention also provides a plastic film suitable for the support of the adhesive sheet used in the method of the present invention.

The plastic film of the present invention is characterized in that the plastic film satisfies the following conditions (TD1) and (TD2) in a TD direction thereof when heated under the following heating condition.

Heating condition: A temperature is increased from 20° C. to 100° C. at a rate of 8° C./minute, maintained at 100° C. for 30 minutes, then increased to 180° C. at a rate of 8° C./minute, and maintained at 180° C. for 30 minutes.

Condition (TD1): A maximum expansion rate $E_{ATD}$ (%) is 0.9% or less.

Condition (TD2): A difference between the maximum expansion rate $E_{ATD}$ (%) and an expansion rate at the end of heating $E_{BTD}$ (%), $E_{ATD}-E_{BTD}$, is 0.5% or less.

In the conditions (TD1) and (TD2), preferred ranges of the $E_{ATD}$, $E_{BTD}$, and the difference $E_{ATD}-E_{BTD}$ are the same as described in the section of Adhesive sheet.

The expansion characteristics of the plastic film in an MD direction thereof when the plastic film is heated under the heating condition (reference heating condition) are also the same as described in the section of Adhesive sheet. It is particularly preferable that the plastic film shows the expansion characteristics described in the first embodiment.

The plastic film of the present invention can be prepared by subjecting a plastic film to a pre-heat treatment under such predetermined conditions that both the conditions (TD1) and (TD2) are satisfied. The conditions for the pre-heat treatment are determined according to the types of the plastic material, whether or not stretching treatment has been performed during production of the plastic film, the axial direction of the stretching treatment, the degree of stretching, etc. The conditions for the pre-heat treatment are the same as described in the section of Adhesive sheet.

A surface of the plastic film that comes into contact with the resin composition layer in the production of the adhesive sheet may be subjected to a matte treatment or a corona treatment, so long as the plastic film exhibits the specific expansion characteristics. The plastic film may have a release layer on its surface to be in contact with the resin composition layer, so long as the plastic film exhibits the specific expansion characteristics. The release agent used for the release layer is as described above.

Although the thickness of the plastic film is not particularly limited, it is preferably in a range of 5 μm to 75 μm, more preferably in a range of 10 μm to 60 μm, and still more preferably in a range of 10 μm to 45 μm. When the plastic film is a plastic film with a release layer that has a release layer, it is preferable that the overall thickness of the plastic film with a release layer falls within the above range.

Semiconductor Device.

A semiconductor device can be produced using the printed wiring board obtained by the method of the present invention.

Examples of the semiconductor device may include various semiconductor devices used in electrical products (such as a computer, a cellular phone, a digital camera, and a television) and vehicles (such as a motorcycle, an automobile, a train, a ship, and an airplane).

Other features of the invention will become apparent in the course of the following descriptions of exemplary embodiments which are given for illustration of the invention and are not intended to be limiting thereof.

EXAMPLES

In the following description, "parts" and "%" represent "parts by mass" and "% by mass," respectively, unless otherwise specified.

Various measurement methods and evaluation methods will be described first.

Preparation of Samples for Evaluation and Measurement.

(1) Preparation of Internal Layer Circuit Substrate.

Both sides of a double-sided copper clad laminate with an epoxy resin-glass cloth base material in which an internal layer circuit was formed therein (thickness of copper foil: 18 μm, substrate thickness: 0.8 mm, "R1515A" manufactured by Panasonic Electric Works Co., Ltd.) were immersed into "CZ8100" available from Mec Co., Ltd., whereby the copper surface was subjected to a roughening treatment.

(2) Lamination of Adhesive Sheet.

Each of adhesive sheets prepared in the Examples and Comparative Examples was laminated onto both sides of the internal layer circuit substrate using a batch-type vacuum pressure laminator ("MVLP-500" manufactured by Meiki Co., Ltd.) so that the resin composition layer was in contact with the internal layer circuit substrate. The lamination was carried out by reducing the pressure for 30 seconds to an air pressure of 13 hPa or less and then pressing for 30 seconds at 100° C. under a pressure of 0.74 MPa. Each adhesive sheet was laminated after removing the protective film.

(3) Thermally Curing of Resin Composition.

After the lamination of adhesive sheet, the resin composition layer was thermally cured under the conditions of 100° C. for 30 minutes and subsequently at 180° C. for 30 minutes in a state that the support was attached to the resin composition layer, thereby forming an insulating layer. The thickness of the resultant insulating layer on the copper circuit was 35 μm.

(4) Removal of Support.

After the formation of insulating layer, the support was peeled and removed. The resultant board is referred to as an "evaluation board A."

(5) Roughening Treatment.

The evaluation board A was immersed in a swelling solution ("Swelling Dip Securiganth P" available from Atotech Japan K. K., an aqueous solution of sodium hydroxide containing diethylene glycol monobutyl ether) at 60° C. for 5 minutes, then immersed in an oxidant solution ("Concentrate Compact CP" available from Atotech Japan K. K., an aqueous solution containing about 6% by mass of potassium permanganate and about 4% by mass of sodium hydroxide) at 80° C. for 20 minutes, and finally immersed in a neutralization solution ("Reduction Solution Securiganth P" available from Atotech Japan K. K., an aqueous solution containing hydroxylamine sulfate) at 40° C. for 5 minutes. Then the board was dried at 80° C. for 30 minutes. The resultant board is referred to as an "evaluation board B."

(6) Formation of Conductive Layer.

Next, a conductive layer was formed on the surface of the insulating layer after the roughening treatment according to the semi-additive method.

Specifically, the evaluation board B was immersed in an electroless plating solution containing palladium chloride ($PdCl_2$) and then immersed in an electroless copper plating solution to form a plating seed layer on the surface of the insulating layer. The resultant board was heated at 150° C. for 30 minutes to perform an annealing treatment. Thereafter, an etching resist was provided on the plating seed layer, and etching was performed to form a pattern in the plating seed layer. Then, copper sulfate electroplating was performed to form a conductive layer (copper layer) having a thickness of 25±5 and then annealing treatment was performed at 180° C. for 60 minutes. The resultant board is referred to as an "evaluation board C."

Measurement of Expansion Rate of Support.

Measurement of Expansion Rate of Support in the TD Direction.

Test pieces with dimensions of 20 mm×4 mm were cut from the supports prepared in the Examples and Comparative Examples such that each test piece had its long side extending in the TD direction. For each test piece, its expansion rate was measured using a thermomechanical analysis apparatus ("TMA-SS6100" manufactured by Seiko Instruments Inc.) in an air atmosphere at a load of 9.8 mmN under the following reference heating condition. The expansion rate was measured over the entire heating process, and the maximum expansion rate $E_{ATD}$ and the expansion rate at the end of heating $E_{BTD}$ were determined.

Reference heating conditions: A temperature is increased from 20° C. to 100° C. at a rate of 8° C./minute, maintained at 100° C. for 30 minutes, then increased to 180° C. at a rate of 8° C./minute, and maintained at 180° C. for 30 minutes.

Measurement of Expansion Rate of Support in the MD Direction.

Test pieces with dimensions of 20 mm×4 mm were cut from the supports prepared in the Examples and Comparative Examples such that each test piece had its long side extending in the MD direction. For each test piece, the maximum expansion rate $E_{AMD}$ and the expansion rate at the end of heating $E_{BMD}$ were determined in the same manner as described above.

Measurement of Surface Resin Thickness of Insulating Layer.

The surface resin thickness of an insulating layer was measured according to the following procedure. SEM observation was performed for a cross section in a thickness direction of an evaluation board A, and the distance from the surface of the insulating layer to an edge point in the insulating layer surface side of the inorganic filler that was closest to the surface of the insulating layer was calculated. The SEM observation was performed using a focused ion beam/scanning ion microscope ("SU-1500" manufactured by Hitachi High-Technologies Corporation). The width of the measurement region was 7.5 μm.

Measurement of Arithmetic Average Roughness Ra.

The arithmetic average roughness Ra of the surface of an insulating layer after the roughening treatment was measured according to the following procedure. For an evaluation board B, an Ra value was determined from numerical values obtained in a measurement region of 121 μm×92 μm in a VSI contact mode with a 50-times lens using a non-contact type surface roughness meter ("WYKO GT-X3" manufactured by Veeco Instruments Inc.). The Ra value (nm) was determined from the obtained values. For each evaluation board, the measurement was performed in five regions randomly selected. TABLE 2 shows the maximum Ra value ($Ra_{max}$) and the minimum Ra value ($Ra_{min}$).

Measurement of Peel Strength.

The peel strength between an insulating layer and a conductive layer was measured according to the following procedure. Cuts were made in a portion of 10 mm in width and 100 mm in length of the conductive layer of an evaluation board C. One end of this portion was peeled and held by a holder, and a load (kgf/cm) at the time of peeling to an extent of 35 mm in a vertical direction at a rate of 50 mm/minute at room temperature was measured as the peel strength. In the measurement, a tensile testing device (AUTO COM-type testing instrument "AC-50C-SL" manufactured by T.S.E. Co., Ltd.) was used.

The pre-heat condition used when preparing the supports in Examples and Comparative Examples are shown in TABLE 1.

TABLE 1

| | Pre-heat condition | | | | | | |
|---|---|---|---|---|---|---|---|
| | 1 | 2 | 3 | 4 | 5 | 6 | 7 |
| Heating temp. (° C.) | 150 | 180 | 180 | 120 | 150 | 200 | 200 |
| Heating time (min) | 30 | 2 | 30 | 30 | 2 | 2 | 30 |

Example 1

(1) Preparation of Support

A PET film with an alkyd resin-based release layer ("AL5" available from LINTEC Corporation, thickness: 38 μm, the PET film may hereinafter be referred to as a "release PET film") was heated in an air atmosphere at normal pressure under the pre-heat condition 1 described in TABLE 1, thus obtaining a support.

(2) Preparation of Resin Varnish

30 Parts of a biphenyl-type epoxy resin (epoxy equivalent weight: about 290, "NC3000H" available from Nippon Kayaku Co., Ltd.), 5 parts of a naphthalene-type tetrafunctional epoxy resin (epoxy equivalent weight: 162, "HP-4700" available from DIC corporation), 15 parts of a liquid bisphenol A-type epoxy resin (epoxy equivalent weight: 180, "jER828EL" available from Mitsubishi Chemical Corporation), and 2 parts of a phenoxy resin (weight average molecular weight: 35,000, "YL7553BH30" available from Mitsubishi Chemical Corporation, methyl ethyl ketone (MEK) solution containing 30% by mass of solid content) were dissolved in a solvent mixture of 8 parts of MEK and 8 parts of cyclohexanone under heating and stirring. Then 32 parts of a triazine skeleton-containing phenol novolac-based curing agent (phenolic hydroxyl group equivalent: about 124, "LA-7054" available from DIC corporation, MEK solution containing 60% by mass of a non-volatile component), 0.2 parts of a phosphorus-based accelerator ("TBP-DA" available from Hokko Chemical Industry Co., Ltd., tetrabutylphosphonium decanoate), 160 parts of spherical silica ("SOC2" available from Admatechs Company Limited, average particle diameter: 0.5 µm) surface-treated with an aminosilane-based coupling agent ("KBM573" available from Shin-Etsu Chemical Co., Ltd.), and 2 parts of a polyvinyl butyral resin solution (weight average molecular weight: 27,000, glass transition temperature: 105° C., "KS-1" available from Sekisui Chemical Co., Ltd., a solvent mixture of ethanol and toluene at a mass ratio of 1:1 that contains 15% by mass of non-volatile component) were mixed thereto. The resultant was dispersed uniformly using a high-speed mixer to prepare a resin varnish. When the total mass of the non-volatile components in the resin varnish was defined as 100% by mass, the content of the inorganic filler (spherical silica) was 69.4% by mass.

(3) Preparation of Adhesive Sheet

The resin varnish prepared in (2) above was uniformly applied to the release layer of the support prepared in (1) above using a die coater and dried at 80 to 120° C. (100° C. on average) for 6 minutes to form a resin composition layer.

The thickness of the resultant resin composition layer was 40 µm, and the amount of the remaining solvent was about 2% by mass. Next, while a polypropylene film (thickness: 15 µm) used as a protective film was laminated on the resin composition layer, the resultant film was wound into a roll form. The obtained adhesive sheet in a roll form was cut to a width of 507 mm, thus obtaining an adhesive sheet with dimensions of 507 mm×336 mm.

Example 2

A support and an adhesive sheet were prepared in the same manner as in Example 1 except that the release PET film was heated under the pre-heat condition 2 described in TABLE 1.

Example 3

A support and an adhesive sheet were prepared in the same manner as in Example 1 except that the release PET film was heated under the pre-heat condition 3 described in TABLE 1.

Comparative Example 1

A support and an adhesive sheet were prepared in the same manner as in Example 1 except that the release PET film was used as it is as a support without preheating.

Comparative Example 2

A support and an adhesive sheet were prepared in the same manner as in Example 1 except that the release PET film was heated under the pre-heat condition 4 described in TABLE 1.

Comparative Example 3

A support and an adhesive sheet were prepared in the same manner as in Example 1 except that the release PET film was heated under the pre-heat condition 5 described in TABLE 1.

Comparative Example 4

A support and an adhesive sheet were prepared in the same manner as in Example 1 except that the release PET film was heated under the pre-heat condition 6 described in TABLE 1.

Comparative Example 5

A support and an adhesive sheet were prepared in the same manner as in Example 1 except that the release PET film was heated under the pre-heat condition 7 described in TABLE 1.
The results of evaluation are shown in TABLE 2.

TABLE 2

|  |  | Example | | | Comparative Example | | | | |
|---|---|---|---|---|---|---|---|---|---|
|  |  | 1 | 2 | 3 | 1 | 2 | 3 | 4 | 5 |
| Expansion rate of support | $E_{ATD}$ (%) | 0.70 | 0.80 | 0.88 | 1.10 | 0.98 | 1.03 | 0.89 | 1.08 |
|  | $E_{BTD}$ (%) | 0.32 | 0.50 | 0.73 | 0.53 | 0.30 | 0.48 | 0.27 | 1.07 |
|  | $E_{ATD} - E_{BTD}$ (%) | 0.38 | 0.30 | 0.15 | 0.57 | 0.68 | 0.55 | 0.62 | 0.01 |
|  | $E_{BMD}$ (%) | −1.3 | −1.2 | −1.0 | −1.3 | −1.0 | −1.1 | −1.7 | −1.0 |
| Result of evaluation | Peel strength (kgf/cm) | 0.6 | 0.5 | 0.5 | 0.25 | 0.4 | 0.4 | 0.25 | 0.4 |
|  | $Ra_{min}$ (nm) | 208 | 205 | 240 | 120 | 230 | 250 | 80 | 150 |
|  | $Ra_{max}$ (nm) | 228 | 229 | 268 | 400 | 340 | 410 | 220 | 250 |
|  | $Ra_{max} - Ra_{min}$ (nm) | 20 | 24 | 28 | 280 | 110 | 160 | 140 | 100 |
|  | Surface resin thickness (nm) | 230 | 310 | 250 | 0 | 100 | 60 | 50 | 120 |

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A method for producing a printed wiring board, comprising the following steps (A) to (C) in this order:
   (A) laminating, onto an internal layer substrate, an adhesive sheet which comprises a support formed of polyethylene terephthalate and a resin composition layer in contact with the support, so that the resin composition layer is in contact with the internal layer substrate;
   (B) thermally curing said resin composition layer to form an insulating layer; and
   (C) removing said support,
   wherein
   when said support is heated under the following heating condition, said support satisfies the following conditions (TD1) and (TD2) in a TD direction thereof,
   heating condition: a temperature is increased from 20° C. to 100° C. at a rate of 8° C./minute, maintained at 100° C. for 30 minutes, then increased to 180° C. at a rate of 8° C./minute, and maintained at 180° C. for 30 minutes,
   condition (TD1): a maximum expansion rate $E_{ATD}$ (%) is 0.9% or less, and
   Condition (TD2): a difference between the maximum expansion rate $E_{ATD}$ (%) and an expansion rate at the end of heating $E_{BTD}$ (%), $E_{ATD}-E_{BTD}$, is 0.5% or less.

2. A method according to claim 1, wherein said resin composition layer comprises an inorganic filler in an amount of 50% by mass or more.

3. A method according to claim 1, wherein, when said support is heated under said heating condition, said support has an expansion rate $E_{BMD}$ (%) of less than 0% in an MD direction thereof at the end of heating.

4. A method according to claim 1, wherein said step (B) comprises:
   (i) heating said resin composition layer at a temperature $T_1$ (50° C.≤$T_1$<150° C.), to obtain a heated resin composition layer; and
   (ii) thermally curing said heated resin composition layer at a temperature $T_2$ (150° C.≤$T_2$≤240° C.).

5. An adhesive sheet, comprising:
   a support formed of polyethylene terephthalate that satisfies the following conditions (TD1) and (TD2) in a TD direction thereof when the support is heated under the following heating condition,
   heating condition: a temperature is increased from 20° C. to 100° C. at a rate of 8° C./minute, maintained at 100° C. for 30 minutes, then increased to 180° C. at a rate of 8° C./minute, and maintained at 180° C. for 30 minutes,
   condition (TD1): a maximum expansion rate $E_{ATD}$ (%) is 0.9% or less, and
   condition (TD2): a difference between the maximum expansion rate $E_{ATD}$ (%) and an expansion rate at the end of heating $E_{BTD}$ (%), $E_{ATD}-E_{BTD}$, is 0.5% or less; and
   a resin composition layer in contact with said support.

6. An adhesive sheet according to claim 5, wherein, when said support is heated under said heating condition, said support has an expansion rate $E_{BMD}$ (%) of less than 0% in an MD direction thereof at the end of heating.

7. An adhesive sheet according to claim 5, wherein said resin composition layer comprises an inorganic filler in an amount of 50% by mass or more.

8. A plastic film formed of polyethylene terephthalate that satisfies the following conditions (TD1) and (TD2) in a TD direction thereof when the plastic film is heated under the following heating condition,
   heating condition: a temperature is increased from 20° C. to 100° C. at a rate of 8° C./minute, maintained at 100° C. for 30 minutes, then increased to 180° C. at a rate of 8° C./minute, and maintained at 180° C. for 30 minutes,
   condition (TD1): a maximum expansion rate $E_{ATD}$ (%) is 0.9% or less, and
   condition (TD2): a difference between the maximum expansion rate $E_{ATD}$ (%) and an expansion rate at the end of heating $E_{BTD}$ (%), $E_{ATD}-E_{BTD}$, is 0.5% or less.

9. A semiconductor device, comprising a printed wiring board produced by a method according to claim 1.

* * * * *